US010211190B2

(12) United States Patent
Kim

(10) Patent No.: US 10,211,190 B2
(45) Date of Patent: Feb. 19, 2019

(54) SEMICONDUCTOR PACKAGES HAVING REDUCED STRESS

(71) Applicant: Samsung Electronics Co., Ltd., Suwon-si (KR)

(72) Inventor: Yonghoon Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/405,881

(22) Filed: Jan. 13, 2017

(65) Prior Publication Data

US 2017/0278830 A1 Sep. 28, 2017

(30) Foreign Application Priority Data

Mar. 24, 2016 (KR) .................. 10-2016-0035442

(51) Int. Cl.
*H01L 23/34* (2006.01)
*H01L 25/10* (2006.01)
*H01L 23/373* (2006.01)
*H01L 23/528* (2006.01)
*H01L 23/538* (2006.01)
*H01L 23/552* (2006.01)
(Continued)

(52) U.S. Cl.
CPC ........ *H01L 25/105* (2013.01); *H01L 23/3736* (2013.01); *H01L 23/5286* (2013.01); *H01L 23/5389* (2013.01); *H01L 23/552* (2013.01); *H01L 23/562* (2013.01); *H01L 25/50* (2013.01); *H01L 2225/107* (2013.01); *H01L 2225/1035* (2013.01); *H01L 2225/1041* (2013.01); *H01L 2225/1058* (2013.01)

(58) Field of Classification Search
CPC . H01L 23/552; H01L 23/562; H01L 23/3736; H01L 23/5286; H01L 23/5289; H01L 23/49822; H01L 23/60; H01L 25/0657; H01L 25/105; H01L 2225/1041; H01L 2225/1035; H01L 2225/1058; H01L 2225/107; H01L 23/5389; H01L 25/50
USPC .................. 257/774, 173, 659, 723, 725
See application file for complete search history.

(56) References Cited

U.S. PATENT DOCUMENTS 8,872,319 B2 10/2014 Kim et al.
9,070,677 B2 6/2015 Park
(Continued)

FOREIGN PATENT DOCUMENTS

JP        03120746 A  * 5/1991 ............. H01L 23/28
KR   1020070076084     7/2007
(Continued)

OTHER PUBLICATIONS

Machine translation of Um et al (KR-101478510 A), for original see copy made of record by applicant (IDS), said machine translation obtained online from the European Patent Office, cf. Office action Appendix.*

*Primary Examiner* — Duy T Nguyen
(74) *Attorney, Agent, or Firm* — Onello & Mello, LLP

(57) ABSTRACT

A semiconductor package comprises a lower package, a metal layer on the lower package, a ground member on the metal layer, coupled thereto, and an upper package on the lower package. The upper package comprises a ground pattern on a first insulation pattern. The first insulation pattern is on a bottom surface of the upper package and has a hole through which the ground pattern is exposed. The ground member extends inside the hole and is coupled to the ground pattern.

12 Claims, 11 Drawing Sheets

(51) Int. Cl.
    *H01L 23/00*         (2006.01)
    *H01L 25/00*         (2006.01)

(56) References Cited

U.S. PATENT DOCUMENTS

| | | | |
|---|---|---|---|
| 9,245,831 B1* | 1/2016 | Huo | H01L 23/49562 |
| 9,362,235 B2 | 6/2016 | Kim et al. | |
| 9,607,967 B1* | 3/2017 | Shih | H01L 25/0657 |
| 2002/0130404 A1* | 9/2002 | Ushijima | H01L 23/16 |
| | | | 257/686 |
| 2005/0009329 A1* | 1/2005 | Tanida | H01L 21/76898 |
| | | | 438/667 |
| 2007/0246813 A1* | 10/2007 | Ong | H01L 23/3128 |
| | | | 257/686 |
| 2008/0157316 A1* | 7/2008 | Yang | H01L 24/24 |
| | | | 257/685 |
| 2012/0292745 A1* | 11/2012 | Park | H01L 23/3128 |
| | | | 257/621 |
| 2013/0328176 A1* | 12/2013 | Chiu | H01L 23/552 |
| | | | 257/659 |
| 2015/0014862 A1 | 1/2015 | Kwon et al. | |
| 2015/0037937 A1 | 2/2015 | Park et al. | |
| 2015/0041975 A1 | 2/2015 | Chung et al. | |
| 2015/0348936 A1* | 12/2015 | Lin | H01L 23/552 |
| | | | 257/659 |

FOREIGN PATENT DOCUMENTS

| | | | |
|---|---|---|---|
| KR | 101478510 | 1/2015 | |
| KR | 101478510 A * | 1/2015 | H01L 23/60 |

\* cited by examiner

SEMICONDUCTOR PACKAGES HAVING REDUCED STRESS

CROSS-REFERENCE TO RELATED APPLICATION

This application claims priority under 35 U.S.C. § 119 from Korean Patent Application 10-2016-0035442 filed on Mar. 24, 2016, the disclosure of which is hereby incorporated by reference in its entirety.

BACKGROUND

The present inventive concept relates to a semiconductor and, more particularly, to a semiconductor package including a lower semiconductor chip and an upper semiconductor chip.

Increasingly in the electronic industry electronic products are manufactured to be lighter, miniaturized, high-speed, multi-functional, high-performance and to have high reliability at a low cost. A semiconductor package is designed to implement a semiconductor chip in a form suitable for use in the electronic product. As the semiconductor package dimensions shrink, warpage of the semiconductor package is increasingly becoming a problem. Furthermore, various research is needed to enhance reliability of the semiconductor package.

SUMMARY

Embodiments of the present inventive concept provide a semiconductor apparatus capable of eliminating or reducing stress.

In one aspect, the present inventive concepts are directed to a semiconductor package comprising a lower package, a metal layer on the lower package, a ground member the metal layer coupled thereto, and an upper package on the lower package. The upper package comprises a ground pattern on a first insulation pattern. The first insulation pattern is on a bottom surface of the upper package and has a hole through which the ground pattern is exposed. The ground member extends inside the hole and is coupled to the ground pattern.

In another aspect, the present inventive concepts are directed to a semiconductor package comprising a lower package including a lower substrate and a lower semiconductor chip, a dummy bump on the lower substrate, the dummy bump spaced apart from the lower semiconductor chip, a metal layer on the lower semiconductor chip and the dummy bump, a conductive pattern interposed between and coupled to the dummy bump and the metal layer, a bump spaced apart from the metal layer on the lower substrate, and an upper package on the lower package, the upper package coupled to the bump.

In another aspect, the present inventive concepts are directed to a semiconductor package comprising a first package including a first semiconductor on a first substrate having a first signal pattern and a first ground pattern. A second package includes a second semiconductor on a second substrate having a second signal pattern and a second ground pattern. A metal shield is between the first package and the second package and is attached to the first package with an adhesive. The metal shield is electrically connected to a ground potential.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION OF EMBODIMENTS

Figure 1A:
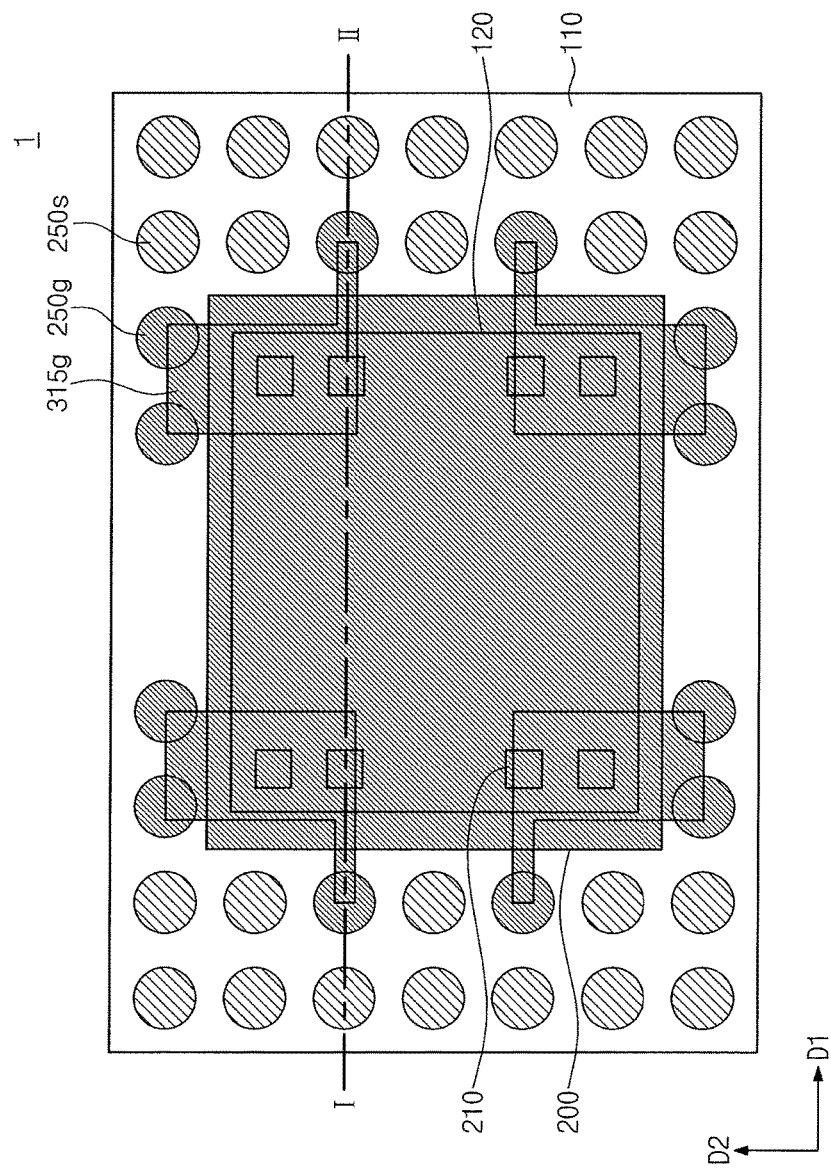
FIG. 1A is a plan view of a semiconductor package according to embodiments of the present inventive concept.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

Figure 1B:
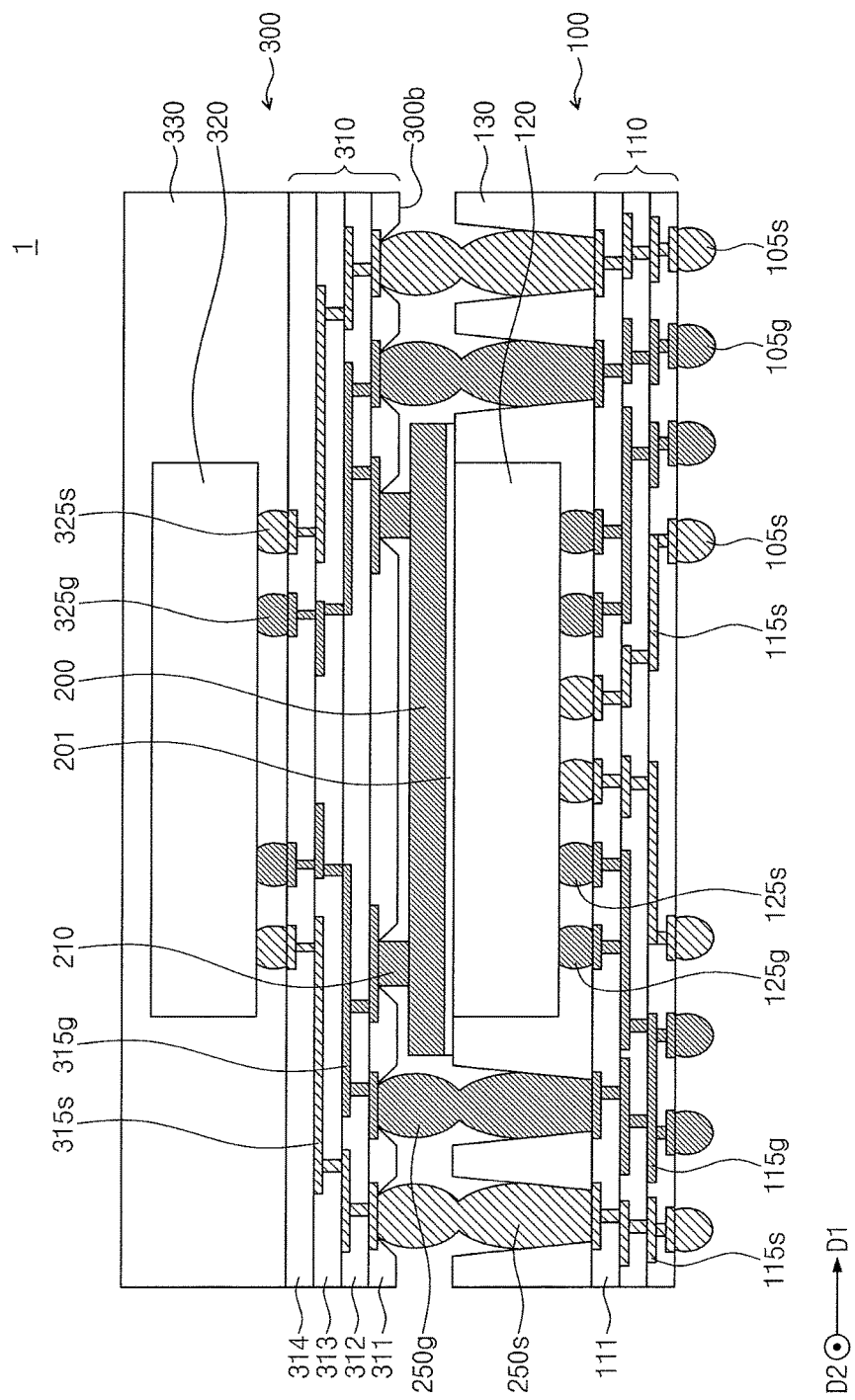
FIG. 1B is a cross-sectional view of FIG. 1A taken along line I-II.

FIG. 1A is a plan view of a semiconductor package according to exemplary embodiments of the present inventive concept. FIG. 1B is a cross-sectional view of FIG. 1A taken along line I-II. Referring to FIG. 1A and FIG. 1B, a semiconductor package 1 may include a lower package 100, a metal layer 200, and an upper package 300. For example, the lower package and the upper package 300 may be assembled in a package-on-package (POP) configuration. The lower package 100 may include a lower substrate 110, a lower semiconductor chip (e.g., integrated circuit) 120, and a lower mold layer 130 used to encase the lower semiconductor chip 120. The lower substrate 110 may be a printed circuit board (PCB), a silicon substrate, or a redistribution layer. The lower substrate 110 may include insulation layers 111, a lower ground pattern 115g, and a lower signal pattern 115s. The lower patterns 115g and 115s may be provided between the insulation layers 111. The lower patterns 115g and 115s may include a metal. The lower ground pattern 115g may be insulated from the lower signal pattern 115s.

A plurality of terminals 105g and 105s may be disposed on a bottom surface of the lower substrate 110. The terminals 105g and 105s may include a conductive material and have a shape of a solder ball. The terminals 105g and 105s may include a ground terminal 105g and a signal terminal 105s. The ground terminal 105g may be coupled to the lower ground pattern 115g. The signal terminal 105s may be coupled to the lower signal pattern 115s. The signal terminal 105s may be insulated from the ground terminal 105g. The phrase to "be electrically connected/coupled to" as used herein means either to "be directly connected/coupled to" or "be indirectly connected/coupled to through other conductive element(s)."

The lower semiconductor chip 120 may be mounted on a top surface of the lower substrate 110. The lower semiconductor chip 120 may include an integrated circuit, (e.g., a logic circuit). A plurality of lower interposers 125g and 125s may be provided between the lower substrate 110 and the lower semiconductor chip 120. The lower interposers 125g and 125s may include a conductive material such as a metal and have a shape of solder bump or pillar. For example, in a solder bump reflow process, a solder bump may have a substantially round or elliptical cross-section that becomes a pillar shape after solder reflow. The lower interposers 125g and 125s may include a lower ground interposer 125g and a lower signal interposer 125s. When the lower semiconductor chip 120 is operated, an electrical signal generated from the lower semiconductor chip 120 may be transmitted to the signal terminal 105s through the lower signal interposer 125s and the lower signal pattern 115s. Likewise, an outer electrical signal may be transmitted to the lower semiconductor chip 120 through the signal terminal 105s, the lower signal pattern 115s, and the lower signal interposer 125s. The lower semiconductor chip 120 may be grounded through the lower ground interposer 125g, the lower ground pattern 115g, and the ground terminal 105g.

The lower mold layer 130 may be in contact with the top surface of the lower substrate 110 and cover sidewalls of the lower semiconductor chip 120 and sidewalls of bumps 250g and 250s. The lower mold layer 130 may be further included in a gap between the lower substrate 110 and the lower semiconductor chip 120. The lower mold layer 130 may include an insulative polymer material such as an epoxy molding compound. Alternatively, an under-fill layer (not shown) may be further provided in a gap between the lower substrate 110 and the lower semiconductor chip 120. In some embodiments, the lower mold layer 130 hermetically seals the lower semiconductor chip 120 against moisture ingress from the operating environment of the semiconductor package 1.

The bumps 250g and 250s may be provided on the lower substrate 110. The bumps 250g and 250s may be laterally spaced apart from the lower semiconductor chip 120. For example, the bumps 250g and 250s may be spaced apart from the lower semiconductor chip 120 in one or both of a first direction D1 or a second direction D2. The first direction D1 may extend in parallel to the top surface of the lower substrate 110. The second direction D2 may extend in parallel to the top surface of the lower substrate 110 and be orthogonal to the first direction D1. The phrase to "be disposed laterally" as used herein may mean to "be disposed in parallel to one or both of the first direction D1 or the second direction D2." The bumps 250g and 250s may include a conductive material such as a metal. The bumps 250g and 250s may include a ground bump 250g and a signal bump 250s. The ground bump 250g may be spaced apart from the signal bump 250s in one or both of the first direction D1 or the second direction D2, and be electrically insulated from the signal bump 250s. The ground bump 250g may be electrically connected to the ground terminal 105g through the lower ground pattern 115g. The signal bump 250s may be electrically connected to the signal terminal 105s through the lower signal pattern 115s.

The metal layer 200 may be disposed on the lower semiconductor chip 120. The metal layer 200 may further extend onto the lower mold layer 130. The metal layer 200 may be laterally spaced apart from the bumps 250g and 250s. In one embodiment, a space between the metal layer 200 and the bumps 250g and 250s is sufficient to prevent electrical conduction therebetween. The metal layer 200 may have a thickness in the range of about 10 μm to about 100 μm. The metal layer 200 may prevent or reduce warpage of the lower package 100 which may occur when the semiconductor package 1 is fabricated, or the lower semiconductor chip 120 is operated. For example, fabrication or operation of the lower semiconductor chip 120 may cause differential thermal stress in different areas of the semiconductor package 1, which could physically distort or warp the semiconductor package 1. If the metal layer 200 has a thickness less than about 10 μm, the metal layer 200 may have difficulty preventing warpage of the lower package 100. If the metal layer 200 has a thickness more than about 100 μm, the lower package 100 may have an excessive thickness. In various embodiments, the metal layer 200 may include copper or aluminum. In various embodiments, excessive thickness of the metal layer 200 may require excessively large bumps 250s and 250g, which will also require increased spacing between the bumps 250s and 250g.

An adhesive layer 201 may be interposed between the lower semiconductor chip 120 and the metal layer 200. The metal layer 200 may be adhered to the lower semiconductor chip 120 with the adhesive layer 201. The adhesive layer 201 may extend onto the lower mold layer 130. In one example, the adhesive layer 201 may include a non-conductive film (NCF). In another embodiment, the adhesive layer 201 may include a thermal interface material (TIM). The metal layer 200 and the thermal interface material may have thermal conductivity greater than that of each of the lower mold layer 130 and air. In this case, when the semiconductor package 1 is operated, heat is exhausted from the lower semiconductor chip 120 through the adhesive layer 201 and the metal layer 200. The lower semiconductor chip 120 may thus have an enhanced reliability of operation.

The upper package 300 may be disposed on the lower package 100 with the metal layer 200 interposed therebetween. The upper package 300 may include an upper substrate 310, an upper semiconductor chip 320, and an upper mold layer 330. The upper substrate 310 may be a printed circuit board (PCB) or a redistribution layer. The upper substrate 310 may include first to fourth insulation patterns 311, 312, 313 and 314 respectively, an upper ground pattern 315g, and an upper signal pattern 315s. The first insulation pattern 311 may be disposed on a bottom surface 300b of the upper package 300. The number of the insulation patterns 311-314 is not limited to those shown in figures. In other embodiments, the number of insulation patterns may be less than four or more than four. The upper ground pattern 315g and the upper signal pattern 315s may be interposed between the insulation patterns 311-314. The upper ground pattern 315g may include a conductive layer, a via, and a pad that are electrically connected to one another. As shown in FIG. 1A, the upper ground pattern 315g may include a polygonal shaped conductive layer as viewed in plan view. However, the upper ground pattern 315g may have various planar shapes and planar areas. The upper ground pattern 315g may be coupled to the ground bump 250g. The upper signal pattern 315s may include a line, a via, and a pad that are electrically connected to one another. The upper ground pattern 315g may be insulated from the upper signal pattern 315s. The upper signal pattern 315s may be coupled to the signal bump 250s.

The upper semiconductor chip 320 may be mounted on the upper substrate 310. The upper semiconductor chip 320 may include an integrated circuit, (e.g., a memory circuit). A plurality of upper interposers 325g and 325s may be provided in a gap between the upper substrate 310 and the upper semiconductor chip 320. The upper interposers 325g and 325s may have a shape of a bump, a solder ball, or a pillar. In another embodiment (not shown), the upper interposers 325g and 325s may be bonding wires provided on a top surface of the upper semiconductor chip 320. The upper interposers 325g and 325s may include a metal. The upper interposers 325g and 325s may include an upper ground interposer 325g and an upper signal interposer 325s. The upper ground interposer 325g and the upper signal interposer 325s may be coupled to the upper ground pattern 315g and the upper signal pattern 315s, respectively. The upper ground interposer 325g may be electrically insulated from the upper signal interposer 325s. The upper mold layer 330 may be provided on the upper substrate 310 and cover the upper semiconductor chip 320. In various embodiments, the upper mold layer 330 hermetically seals and the upper semiconductor chip 320 from moisture in the environment within which the semiconductor package 1 operates.

A ground member 210 may be provided between the metal layer 200 and the upper substrate 310. The ground member 210 may include a conductive adhesive material. For example, the ground member 210 may include a polymer and conductive particles dispersed in the polymer. The conductive particles may include copper or aluminum. As shown in FIG. 1A, the ground member 210 may have a rectangular planar shape. The planar shape and number of the ground member 210 may not be limited to those shown in figures but have numerous modifications. For example, the ground member 210 may have a planar shape of a circle, an ellipse, or a polygon. The ground member 210 may be coupled to the metal layer 200. The ground member 210 may extend inside the first insulation pattern 311 and thus be coupled to the upper ground pattern 315g. The ground member 210 may prevent the semiconductor package 1 from electrical damage caused by an electrostatic discharge (ESD) at the metal layer 200. For example, if the metal layer 200 is not grounded, charges may accumulate on the metal layer 200. When the metal layer 200 has accumulated a certain amount of charge, the charge may move from the metal layer 200 into circuit patterns in the semiconductor chips 120 and 320, the patterns 115g, 115s, 315g and 315s in the substrates 110 and 310, the interposers 125g, 125s, 325g and 325s, or other conductive components, which may result in damage thereto. For example, the charge accumulated on the metal layer 200 may induce a charge into the aforementioned elements through capacitive coupling. In another example, the charge may transfer to the aforementioned elements through tunneling. In some embodiments, the metal layer 200 may be electrically connected to the ground terminal 105g through the ground member 210, the upper ground pattern 315g, the ground bump 250g, and the lower ground pattern 115g. The metal layer 200 may be grounded such that the semiconductor package 1 may have an enhanced reliability.

The metal layer 200 may absorb electric or magnetic fields (or both) generated from the semiconductor package 1 to shield the semiconductor chips 120 and 320, and related connections, from electromagnetic interference (EMI). The metal layer 200 may have improved EMI shielding characteristics, because the metal layer 200 is grounded.

Figure 1C:
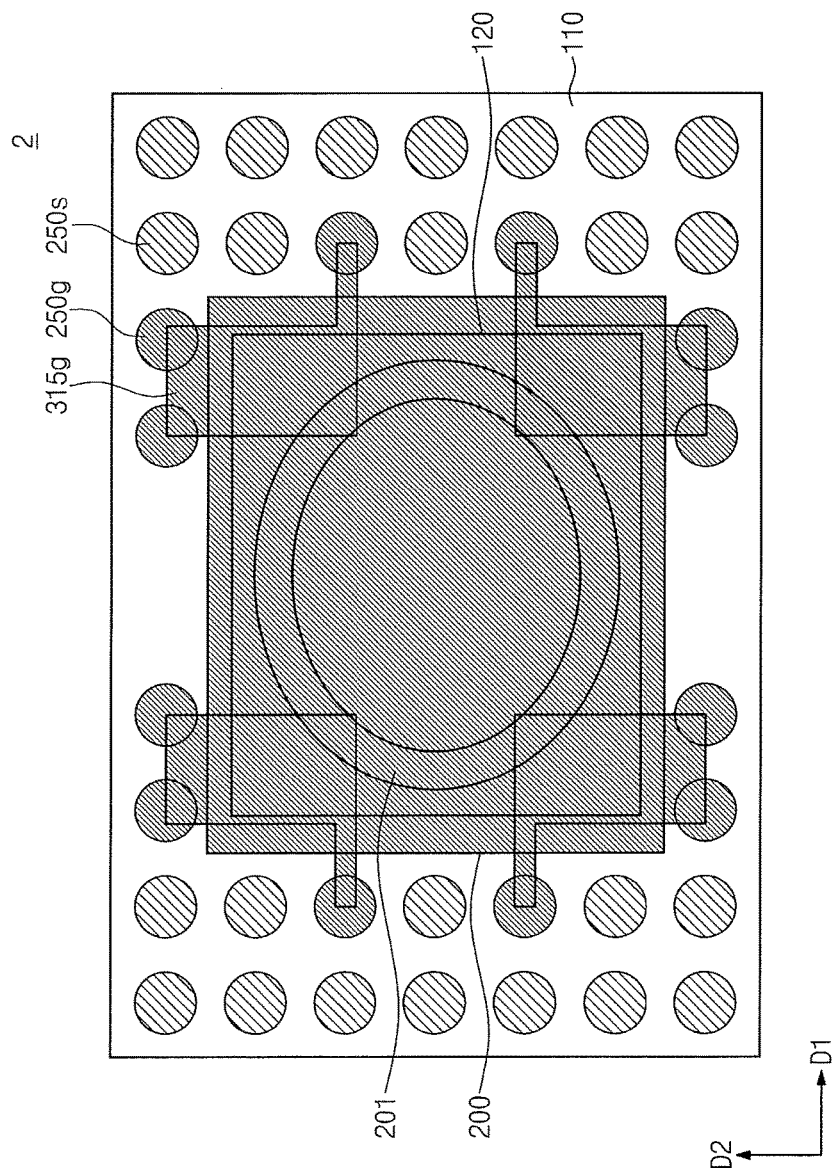
FIG. 1C is a plan view of a semiconductor package according to embodiments of the present inventive concept.

FIG. 1C is a plan view of a semiconductor package according to embodiments of the present inventive concept. In the description of the embodiment that follows, the explanation of features identical to those in the foregoing embodiment will be omitted to avoid repetition.

Referring to FIG. 1C together with FIG. 1B, a semiconductor package 2 may include a lower package 100, bumps 250g and 250s, and an upper package 300. A metal layer 200 may be provided on a lower semiconductor chip 120. The metal layer 200 may be adhered to the lower semiconductor chip 120 with an adhesive layer 201. The metal layer 200 may prevent the lower package 100 from warpage.

In various embodiments, a ground member 210 may be provided as a single instance or as multiple instances. The ground member 210 may be provided to overlap the metal layer 200 in plan view. The ground member 210 may have a shape of closed loop. The planar shape and number of instances of the ground member 210 may not be limited to those shown in the figures but may have numerous modifications. As shown in FIG. 1B, the ground member 210 may be provided between the metal layer 200 and an upper substrate 310, and may be coupled to the metal layer 200 and an upper ground pattern 315g of the upper substrate 310.

Figure 2A:
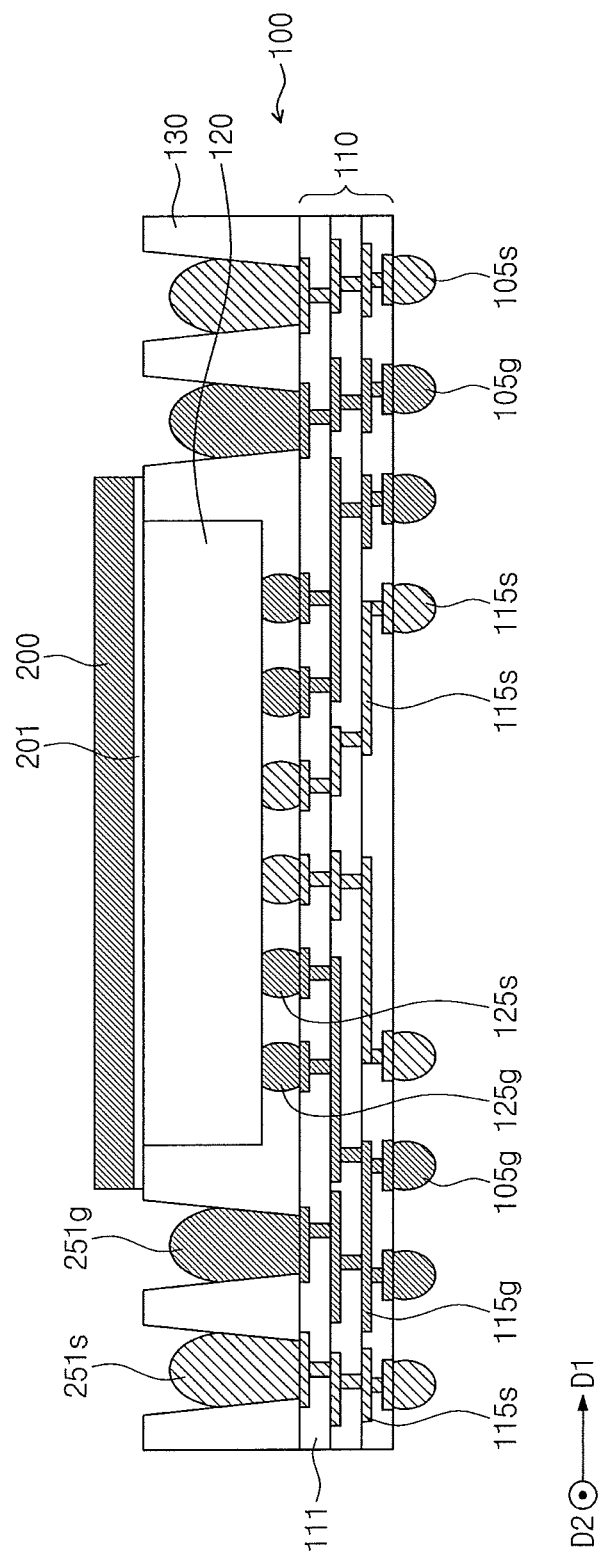
FIG. 2A to FIG. 2C are cross-sectional views of FIG. 1A, taken along line I-II, illustrating a fabrication state of a semiconductor package according to embodiments of the present inventive concept.
Figure 2B:
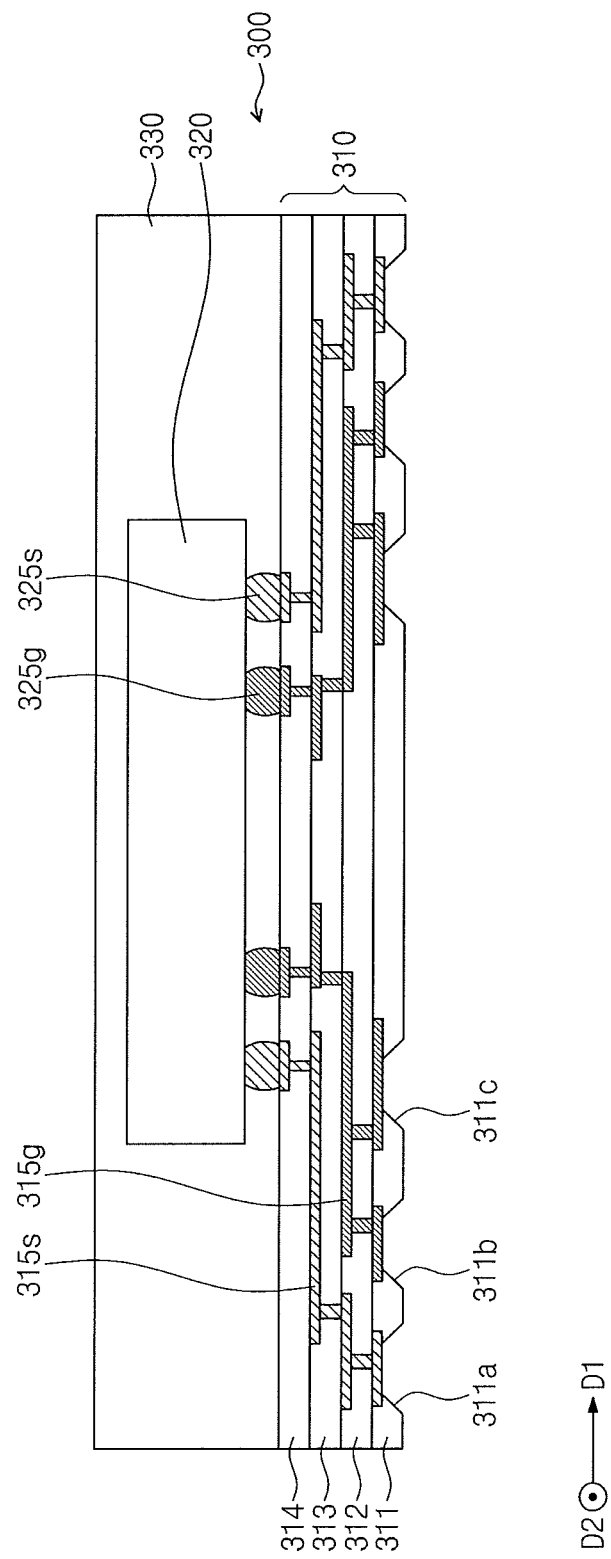
Figure 2C:
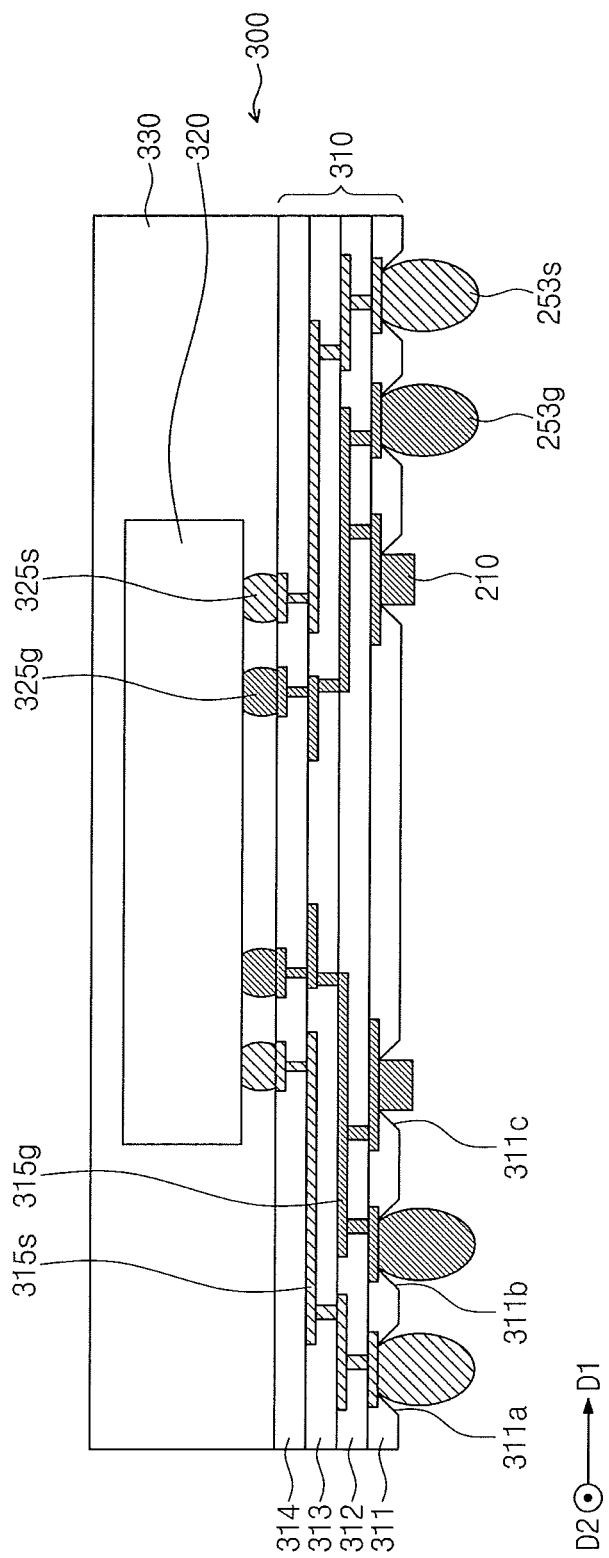

FIG. 2A to FIG. 2C are cross-sectional views of FIG. 1A, taken along line I-II, illustrating a fabrication state of a semiconductor package according to embodiments of the present inventive concept. In the description of the embodiment that follows, the explanation of features identical to those in the foregoing embodiment will be omitted to avoid repetition.

Referring to FIG. 2A, a lower package 100 may be provided. A plurality of terminals 105g and 105s may be formed on a bottom surface of a lower substrate 110. A lower semiconductor chip 120 may be mounted on the lower substrate 110. A plurality of lower solders 251g and 251s may be foil led on the lower substrate 110. A lower ground solder 251g and a lower signal solder 251s may be coupled to a lower ground pattern 115g and a lower signal pattern 115s, respectively. A lower mold layer 130 may be provided on the lower substrate 110 to cover the lower semiconductor chip 120. A drilling process may be performed to partially remove the lower mold layer 130 to expose the top surfaces of the lower solders 251g and 251s.

A metal layer 200 may be provided on the lower semiconductor chip 120. The metal layer 200 may be adhered to the lower semiconductor chip 120 with an adhesive layer 201. Explanations of the metal layer 200 and the adhesive layer 201 may be substantially the same as those described with reference to FIG. 1A and FIG. 1B. The metal layer 200 may be formed before or after the lower solders 251g and 251s are exposed.

Referring to FIG. 2B, an upper package 300 may be provided. The upper package 300 may include an upper substrate 310, an upper semiconductor chip 320, and an upper mold layer 330. A first insulation pattern 311 may be patterned to than first to third holes 311a, 311b and 311c respectively in the first insulation pattern 311. The first insulation pattern 311 may be spaced further apart from the upper semiconductor chip 320 than the second to fourth insulation patterns 312, 313 and 314. The first to third holes 311a to 311c may be spaced apart from one another. The first hole 311a may expose an upper signal pattern 315s. The second and third holes 311b and 311c may expose an upper ground pattern 315g. The first to third holes 311a-311c may be formed by a single process step.

Referring to FIG. 2C, a ground member 210 and a plurality of upper solders 253g and 253s may be formed on the upper substrate 310. For example, an upper signal solder 253s may be formed in the first hole 311a and coupled to the upper signal pattern 315s. An upper ground solder 253g may be formed in the second hole 311b and coupled to the upper ground pattern 315g. A conductive adhesive material may be provided in the third hole 311c and thus the ground member 210 may be formed. The ground member 210 may be coupled to the upper ground pattern 315g. The conductive adhesive material may include a polymer and metal particles within the polymer.

Referring again to FIG. 2A and FIG. 2C together with FIG. 1B, the upper package 300 of FIG. 2C may be disposed on the lower package 100 of FIG. 2A. At this step, the upper ground solder 253g and the upper signal solder 253s may be aligned with the lower ground solder 251g and the lower signal solder 251s, respectively. The ground member 210 may be disposed on the metal layer 200.

In another embodiment, the ground member 210 may not be formed in the third hole 311c at the step of FIG. 2C. In this case, the ground member 210 may be formed on the metal layer 200. Thereafter, the third hole 311c may be aligned with the ground member 210 and thus the upper package 300 may be disposed on the lower package 100.

The upper ground solder 253g and the lower ground solder 251g may be soldered to form a ground bump 250g. The upper signal solder 253s and the lower signal solder 251s may be soldered to form a signal bump 250s. The ground bump 250g and the signal bump 250s may be forming by the single process (e.g., a reflow process). Accordingly, the upper package 300 may be electrically connected to the lower package 100. A semiconductor package 1 may be fabricated through the processes described so far.

Figure 3A:
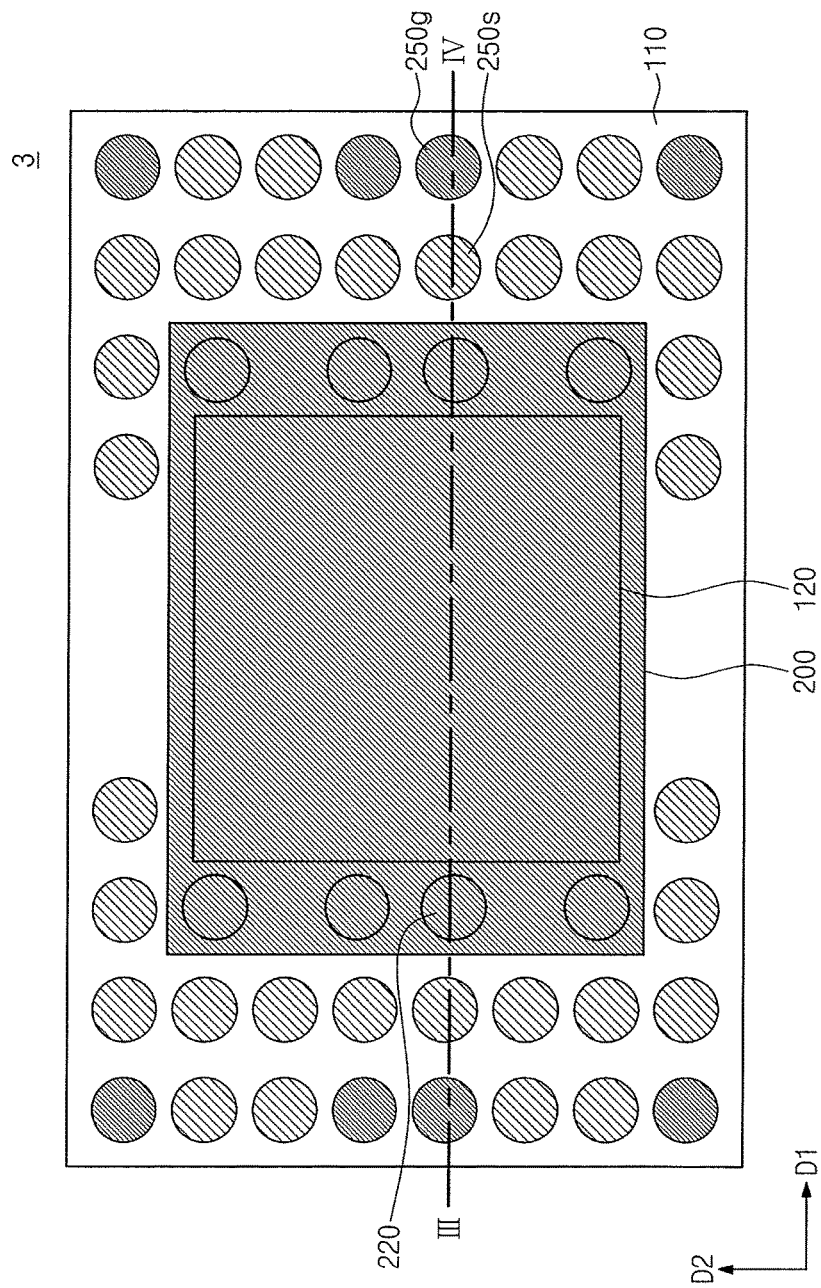
FIG. 3A is a plan view of a semiconductor package according to embodiments of the present inventive concept.
Figure 3B:
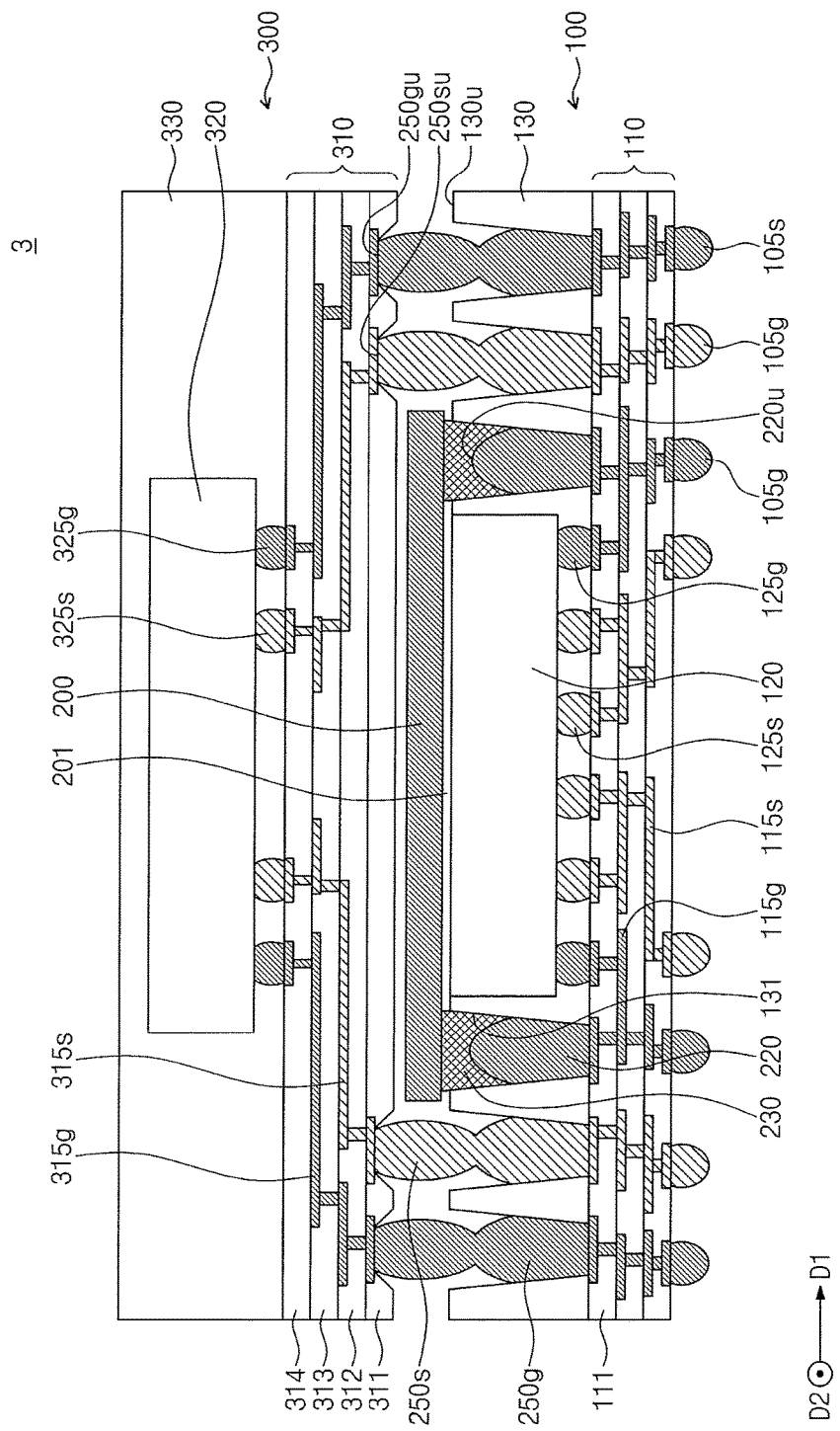
FIG. 3B is a cross-sectional view of FIG. 3A taken along line III-IV.

FIG. 3A is a plan view of a semiconductor package according to exemplary embodiments of the present inventive concept. FIG. 3B is a cross-sectional view of FIG. 3A taken along line III-IV. Referring to FIG. 3A and FIG. 3B, a semiconductor package 3 may include a lower package 100, a metal layer 200, and an upper package 300. A lower semiconductor chip 120 may be electrically connected to a signal terminal 105s through a lower signal interposer 125s and a lower signal pattern 115s. The lower semiconductor chip 120 may be ground through a lower ground interposer 125g, a lower ground pattern 115g, and a ground terminal 105g. The ground terminal 105g may be insulated from the signal terminal 105s.

The upper package 300 may be disposed on the lower package 100. The upper package 300 may include an upper substrate 310, an upper semiconductor chip 320, and an upper mold layer 330. An upper ground interposer 325g and an upper signal interposer 325s may be coupled to an upper ground pattern 315g and an upper signal pattern 315s, respectively.

A plurality of bumps 250g and 250s may be provided on a lower substrate 110. A ground bump 250g may be laterally spaced apart, and insulated, from a signal bump 250s. The ground bump 250g and the signal bump 250s may be coupled to the lower ground pattern 115g and the lower signal pattern 115s, respectively. Top surfaces 250gu and 250su of the respective bumps 250g and 250s may have a level higher than that of a top surface 130u of a lower mold layer 130.

A metal layer 200 may be disposed on the lower semiconductor chip 120 and the lower mold layer 130. The metal layer 200 may be disposed laterally spaced apart from the bumps 250g and 250s. The metal layer 200 may prevent or reduce warpage of the lower package 100. An adhesive layer 201 may be interposed between the lower semiconductor chip 120 and the metal layer 200. The adhesive layer 201 may include a material substantially the same as that described with reference to FIG. 1A and FIG. 1B.

A dummy bump 220 may be provided between the lower substrate 110 and the metal layer 200. In some embodiments, one or more of the dummy bumps 220 may be a bump, which is not used to electrically connect the upper package 300 to the lower package 100. Other embodiments include a combination of electrically conductive and non-electrically conductive dummy bumps 220. As viewed in plan view as shown in FIG. 3A, the dummy bump 220 may overlap the metal layer 200. The dummy bump 220 may be laterally spaced apart from the bumps 250g and 250s. A distance between the lower semiconductor chip 120 and the dummy bump 220 may be less than a distance between the lower semiconductor chip 120 and one of the bumps 250g and 250s. As viewed in plan view, the dummy bump 220 may be provided between the lower semiconductor chip 120 and the bumps 250g and 250s. As shown in FIG. 3B, the dummy bump 220 may have a top surface 220u lower than the top surface 130u of the lower mold layer 130. The dummy bump 220 may be coupled to the lower ground pattern 115g and insulated from the lower signal pattern 115s. In various embodiments, the dummy bump 220 may include copper or aluminum.

A conductive pattern 230 may be provided on the dummy bump 220 within the lower mold layer 130. The lower mold layer 130 may have a first opening 131 through which the top surface 220u of the dummy bump 220 is exposed. The conductive pattern 230 may be provided in the first opening 131. The conductive pattern 230 may be coupled to the dummy bump 220 and the metal layer 200. The conductive pattern 230 may include a conductive adhesive material, (e.g., a polymer containing metal particles therein). The metal layer 200 may be grounded through the conductive pattern 230, the dummy bump 220, the lower ground pattern 115g, and the ground terminal 105g. In some embodiments, the dummy bump 220 and the conductive pattern 230 may prevent electrical damage to the semiconductor package 3 caused by an electrostatic discharge (ESD) of the metal layer 200. The dummy bump 220 and the conductive pattern 230 may allow the metal layer 200 to have enhanced EMI shielding characteristics.

Figure 4A:
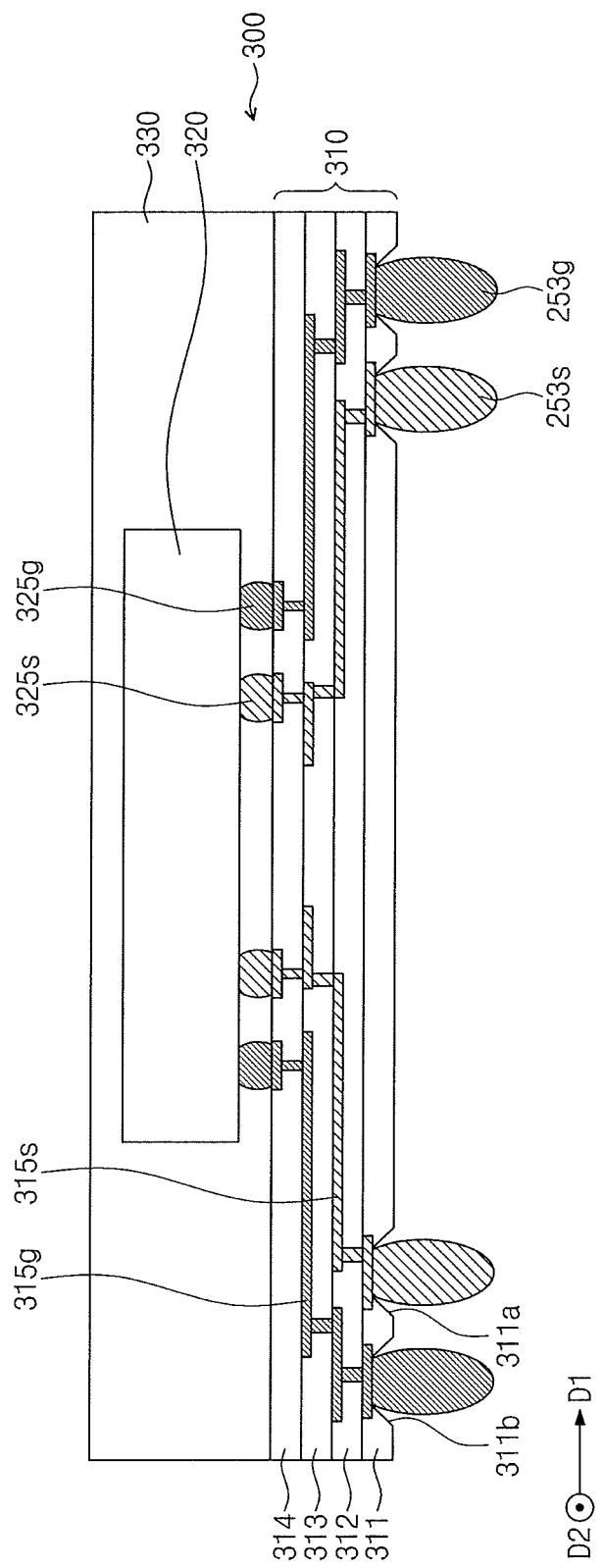
FIG. 4A to FIG. 4C are cross-sectional views, taken along line III-IV of FIG. 3A, illustrating a fabrication state of a semiconductor package according to embodiments of the present inventive concept.
Figure 4B:
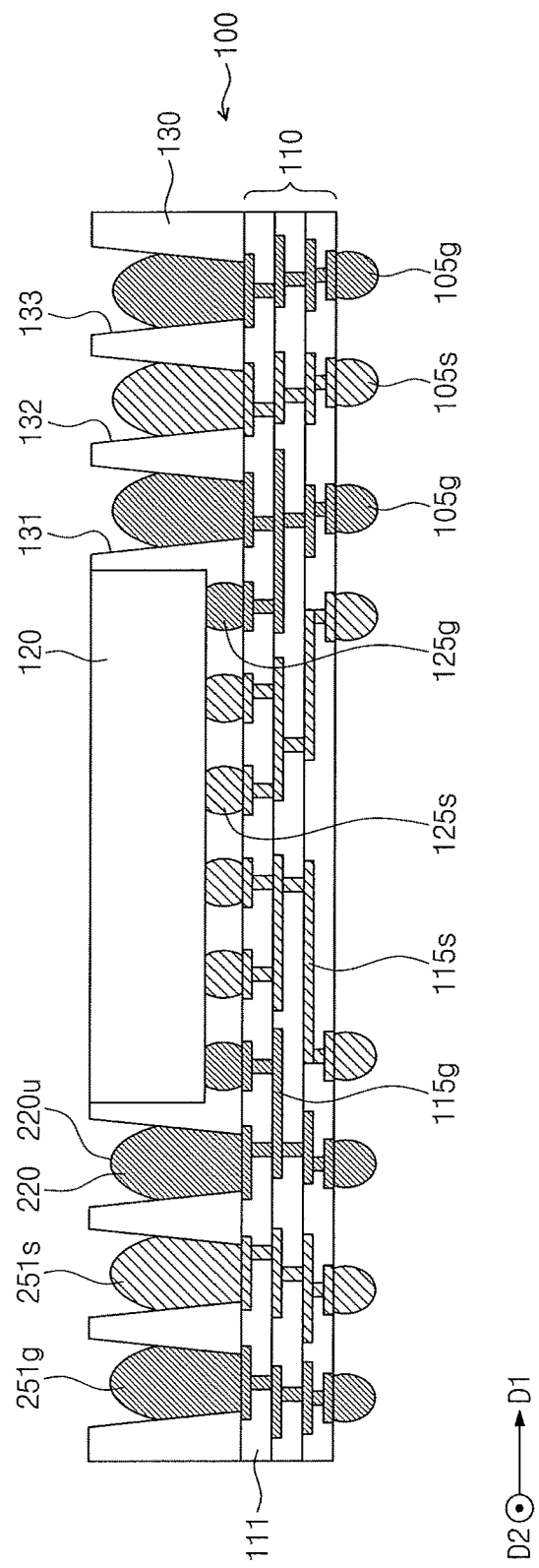
Figure 4C:
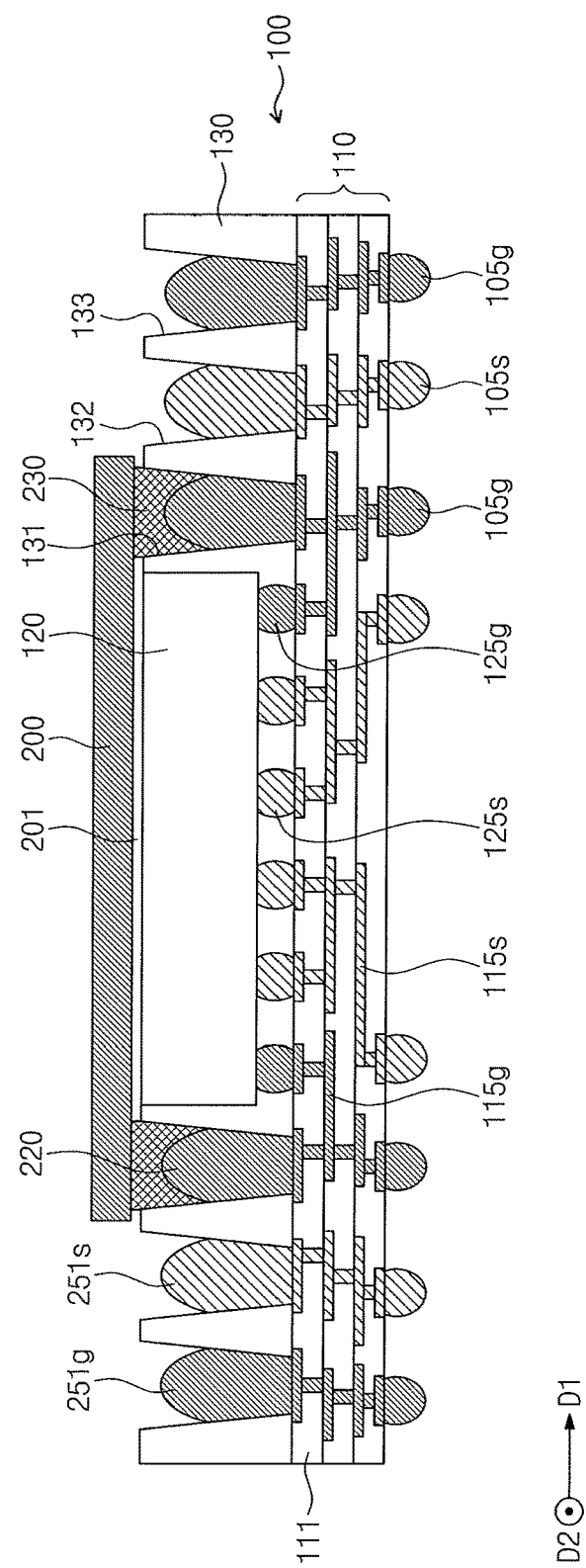

FIG. 4A to FIG. 4C are cross-sectional views of FIG. 3A, taken along line illustrating a fabrication state of a semiconductor package according to embodiments of the present inventive concept. In the description of the embodiment that follows, the explanation of features identical to those in the foregoing embodiment will be omitted to avoid repetition.

Referring to FIG. 4A, an upper package 300 may be provided. The upper package 300 may include an upper substrate 310, an upper semiconductor chip 320, and an upper mold layer 330. An upper signal solder 253s and an upper ground solder 253g may be formed on a bottom surface of the upper substrate 310 and coupled to an upper signal pattern 315s and an upper ground pattern 315g, respectively. The upper semiconductor chip 320 may be mounted on the upper substrate 310. An upper ground interposer 325g and an upper signal interposer 325s may be formed on a top surface of the upper substrate 310 and coupled to the upper ground pattern 315g and the upper signal pattern 315s, respectively.

Referring to FIG. 4B, a lower package 100 may be provided. For example, a lower semiconductor chip 120 may be mounted on a lower substrate 110. A dummy bump 220, a lower ground solder 251g, and a lower signal solder 251s may be formed on the lower substrate 110. The dummy bump 220 may be for red by the same single process used to form the lower ground solder 251g and the lower signal solder 251s. The dummy bump 220 may include a material substantially the same as those of the lower solders 251g and 251s, and may also have substantially the same shape as those of the lower solders 251g and 251s. The dummy bump 220 and the lower ground solder 251g may be coupled to the lower ground pattern 115g. The lower signal solder 251s may be coupled to the lower signal pattern 115s. A lower mold layer 130 may be formed on the lower substrate 110 to cover the dummy bump 220, the lower solders 251g and 251s, and side surfaces of the lower semiconductor chip 120. A drilling process may be conducted to form first to fourth openings 131, 132 and 133 in the lower mold layer 130. The first to third openings 131 to 133 may expose a respective top surface 220u of the dummy bump 220, a top surface of the lower ground solder 251g, and a top surface of the lower signal solder 251s. The first opening 131 may be separated from the second and third openings 132 and 133. The first opening 131 may be formed by the same single process used to form the second and third openings 132 and 133.

Referring to FIG. 4C, a conductive pattern 230 and a metal layer 200 may be provided on the lower substrate 110. For example, a conductive adhesive material may fill the first opening 131 and thus the conductive pattern 230 may be formed. The conductive pattern 230 may be coupled to the dummy bump 220 and spaced apart from the lower solders 251g and 251s. The metal layer 200 may be provided on the lower semiconductor chip 120 and the conductive pattern 230. The metal layer 200 may be adhered to the lower semiconductor chip 120 through an adhesive layer 201. The adhesive layer 201 may not extend onto the conductive pattern 230 or the dummy pattern 220.

Referring again to FIG. 4A and FIG. 4C together with FIG. 3B, the upper package 300 of FIG. 4A may be disposed on the lower package 100 of FIG. 4C. At this step, the upper ground solder 253g and the upper signal solder 253s may be aligned with the lower ground solder 251g and the lower signal solder 251s, respectively. The upper solders 253g and 253s may be soldered with the lower solders 251g and 251s and thus a plurality of bumps 250g and 250s may be formed. Accordingly, the upper package 300 may be electrically connected to the lower package 100. A semiconductor package 3 may be fabricated through the processes described so far.

According to the present inventive concept, the metal layer is provided on the lower semiconductor chip to prevent or reduce warpage of the lower package. The metal layer is grounded to prevent the semiconductor package from being damaged by electrical damage caused by electrostatic discharge (ESD).

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A semiconductor package, comprising:
a lower package;
a metal layer on the lower package;
a ground member on the metal layer, coupled thereto; and
an upper package on the lower package, the upper package comprising a ground pattern on a first insulation pattern;
wherein the first insulation pattern is on a bottom surface of the upper package and has a hole through which the ground pattern is exposed,
wherein the ground member extends inside the hole and is coupled to the ground pattern, sidewalls of the ground member at least partially spaced apart from sidewalls of the hole and the ground member comprises a conductive adhesive material, and
wherein the upper package further comprises:

a signal pattern on the first insulation pattern, the signal pattern insulated from the ground pattern and the ground member; and
a second insulation pattern on the signal pattern and the ground pattern.

2. The semiconductor package of claim 1, wherein
the lower package comprises a lower substrate and a lower semiconductor chip mounted on the lower substrate, and
the upper package further comprises an upper semiconductor chip on the second insulation pattern.

3. The semiconductor package of claim 2, further comprising a bump interposed between the lower substrate and the lower package, the bump spaced apart from the metal layer.

4. The semiconductor package of claim 3, wherein the bump comprises:
a ground bump coupled to the ground pattern; and
a signal bump coupled to the signal pattern.

5. The semiconductor package of claim 1, further comprising an adhesive layer interposed between the lower package and the metal layer.

6. A semiconductor package comprising:
a first package including a first semiconductor chip and a molding layer on a first substrate, the first semiconductor chip having a first signal pattern and a first ground pattern;
a second package including a second semiconductor chip on a second substrate having a second signal pattern and a second ground pattern;
a metal shield between the first package and the second package and attached to an upper surface of the first semiconductor chip with an adhesive, the metal shield electrically connected to a ground potential; and
a ground member on the metal shield, coupled thereto, wherein the ground member comprises a conductive adhesive material,
wherein the ground member is insulated from the first signal pattern and the second signal pattern,
wherein the ground member is connected to the second ground pattern,
wherein the second substrate is spaced apart from the molding layer,
wherein a gap is provided between the second substrate and the molding layer, and
wherein the adhesive is disposed between the first semiconductor chip and the metal shield.

7. The semiconductor package of claim 6 wherein the metal shield is electrically connecting to the first ground pattern through the ground member between the first package and the metal shield.

8. The semiconductor package of claim 6 wherein the first ground pattern is connected to the second ground pattern with a ground bump, and the first signal pattern is connected to the second signal pattern with a signal bump.

9. The semiconductor package of claim 6 wherein the metal shield is electrically connected to the second ground pattern through the conductive adhesive material connected to the second ground pattern.

10. The semiconductor package of claim 6 wherein a thickness of the metal shield is greater than 10 microns and less than 100 microns.

11. The semiconductor package of claim 6, wherein the adhesive comprises a non-conductive film.

12. The semiconductor package of claim 6, wherein at least a portion of the ground member is exposed by the gap.

* * * * *